(12) United States Patent
Kurozumi et al.

(10) Patent No.: US 7,315,479 B2
(45) Date of Patent: Jan. 1, 2008

(54) REDUNDANT MEMORY INCORPORATING SERIALLY-CONNECTED RELIEF INFORMATION STORAGE

(75) Inventors: Tomohiro Kurozumi, Kyoto (JP); Masashi Agata, Osaka (JP); Osamu Ichikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 59 days.

(21) Appl. No.: 11/439,223

(22) Filed: May 24, 2006

(65) Prior Publication Data

US 2006/0268633 A1 Nov. 30, 2006

(30) Foreign Application Priority Data

May 27, 2005 (JP) ............................. 2005-155511

(51) Int. Cl.
 *G11C 29/00* (2006.01)
(52) U.S. Cl. .................. 365/200; 365/240; 365/239; 365/189.12; 365/221; 365/230.08; 365/225.7; 365/201; 365/230.02; 365/230.03; 365/233; 365/195; 714/711; 714/718
(58) Field of Classification Search ................ 365/240, 365/239, 200, 201, 230.02, 230.03, 230.08, 365/195, 233, 225.7, 189.12, 221; 714/711, 714/710, 718
See application file for complete search history.

(56) References Cited

U.S. PATENT DOCUMENTS

| | | | | |
|---|---|---|---|---|
| 4,876,685 A | * | 10/1989 | Rich | 714/723 |
| 4,989,181 A | * | 1/1991 | Harada | 365/200 |
| 5,640,509 A | | 6/1997 | Balmer et al. | 714/42 |
| 5,671,183 A | | 9/1997 | Soenen et al. | 365/189.12 |
| 5,677,917 A | * | 10/1997 | Wheelus et al. | 714/726 |
| 6,181,614 B1 | | 1/2001 | Aipperspach et al. | 365/200 |
| 6,917,558 B2 | | 7/2005 | Matsuoka et al. | 365/230.01 |
| 6,920,072 B2 | * | 7/2005 | Theel | 365/200 |
| 7,047,454 B2 | * | 5/2006 | Kaiser et al. | 714/710 |
| 2001/0006481 A1 | | 7/2001 | Daehn | 365/201 |
| 2004/0165467 A1 | | 8/2004 | Sasaki et al. | 365/225.7 |
| 2004/0208070 A1 | | 10/2004 | Nagata et al. | 365/201 |
| 2006/0268633 A1 | * | 11/2006 | Kurozumi et al. | 365/200 |

FOREIGN PATENT DOCUMENTS

JP 06-084393 3/1994

* cited by examiner

*Primary Examiner*—Andrew Q. Tran
(74) *Attorney, Agent, or Firm*—McDermott Will & Emery LLP

(57) ABSTRACT

A relief processing section which performs a relief process with respect to a redundant memory comprises a plurality of defect relief sections each having shift register circuits (relief information storing section). The shift register circuits are connected in series so as to successively transfer data. A test circuit tests the redundant memory, and serially outputs relief information for relieving a defective cell. The relief processing section stores the relief information into the shift register circuits using a data transfer operation thereof.

12 Claims, 3 Drawing Sheets

REDUNDANT MEMORY INCORPORATING SERIALLY-CONNECTED RELIEF INFORMATION STORAGE

CROSS REFERENCE TO RELATED APPLICATION

This Non-provisional application claims priority under 35 U.S.C. §119(a) on Patent Application No. 2005-155511 filed in Japan on May 27, 2005, the entire contents of which are hereby incorporated by reference.

BACKGROUND OF THE INVENTION

1. Field of the Invention

The present invention relates to a relief technique for a redundant memory in a semiconductor device, and more particularly to, a technique for efficiently transferring relief information in a system in which information for relieving a defective cell is generated by an operation of a test circuit built in a chip.

2. Description of the Related Art

Conventionally, a method has been proposed in which, when a defect is present in a memory, information for avoiding the defective portion is extracted by an operation of a test circuit built in a chip, and based on the information, a fuse element or the like is blown out (see, for example, Patent Document 1).

Patent Document 1: JP 6-84393 A

Recently, system LSIs have had large scales, and the capacity and the number of memories provided on a chip tend to be increased. Therefore, the number of redundant memories provided on a chip is more and more increased, and therefore, the area of test circuits for testing the redundant memories is expected to be increased.

To suppress an increase in the test circuit area, it is effective to suppress the number of test circuits and increase the number of redundant memories which are to be tested by one test circuit. Note that, when one test circuit tests a large number of redundant memories, it is necessary to efficiently transfer information for relieving a defective cell, i.e., relief information.

However, a method for transferring relief information is not specifically indicated in the conventional art. For example, Patent Document 1 only describes a configuration in which information for cutting a fuse which is required to relieve any redundant memory is transferred in parallel (FIG. 2 therein illustrating an example). When the relief information is transferred in parallel, a large number of outputs of a test circuit need to be provided, and in addition, a large number of conductors which serve as transfer channels for relief information need to be provided. Therefore, the circuit area is disadvantageously increased, so that a problem arises.

SUMMARY OF THE INVENTION

An object of the present invention is to provide a semiconductor device which includes a test circuit and in which relief information can be efficiently transferred while an increase in the circuit area is suppressed.

The present invention provides a semiconductor device comprising a redundant memory having a plurality of memory cells and a function of relieving a defective cell which is one of the memory cells which is defective, a test circuit for performing a test with respect to the redundant memory, and when determining that there is a defective cell, outputting relief information for relieving the defective cell, and a relief processing section having a plurality of defect relief sections each having a relief information storing section capable of storing the relief information, for performing a relieve process with respect to the redundant memory. The relief information storing sections are connected in series so as to successively transfer data. In an operation of storing the relief information, the test circuit outputs the relief information serially, and the relief processing section stores the relief information serially output from the test circuit into the relief information storing sections using a data transfer operation thereof.

According to the present invention, in the relief process for performing the relief process with respect to the redundant memory, the relief information storing sections of the plurality of defect relief sections are connected in series so as to successively transfer data. In the relief information storing operation, the relief information serially output from the test circuit is stored into the relief information storing sections of the relief processing sections using the data transfer operation. Therefore, relief information can be efficiently transferred to the relief processing sections, and it is not necessary to provide a large number of conductors (relief information transfer channels), thereby making it possible to suppress an increase in circuit area.

Preferably, the semiconductor device of the present invention is capable of controlling whether or not to store the relief information output from the test circuit into the relief processing section, in accordance with an intake control signal supplied thereto. Thereby, even when relief information output from the test circuit includes other information as well as that which is required for redundancy relief, only required information can be selectively stored into the relief processing section.

In the semiconductor device of the present invention, preferably, each of the plurality of defect relief sections is configured to hold the relief information when the semiconductor device is powered off.

In the semiconductor device of the present invention, preferably, the operation of the redundant memory and the test for the redundant memory by the test circuit are performed in accordance with a first clock, and the relief information storing operation is performed in accordance with a second clock different from the first clock. Thereby, different clocks can be supplied to different operations. For example, a high-speed clock is used as the first clock to perform a test of a redundant memory with high speed, while a low-speed clock is used as the second clock to transfer relief information.

The semiconductor device of the present invention preferably comprises a plurality of pairs of the redundant memory and the relief processing section, and the plurality of relief information storing sections serially connected of the respective plurality of relief processing sections are connected in series so as to successively transfer data. Thereby, even when the test circuit tests a plurality of redundant memories, relief information can be efficiently transferred.

The semiconductor device of the present invention preferably further comprises a relief information external input terminal for inputting relief information from the outside of the semiconductor device, and a selector for selecting and supplying one of the relief information output from the test circuit and the relief information input through the relief information external input terminal, to the relief processing section.

The semiconductor device of the present invention preferably further comprises a relief information externally output terminal for outputting the relief information supplied to the relief processing section, to the outside of the semiconductor device.

Thus, according to the present invention, in a semiconductor device having a test circuit, relief information can be efficiently transferred without an increase in circuit area.

DETAILED DESCRIPTION OF THE PREFERRED EMBODIMENTS

Hereinafter, embodiments of the present invention will be described with reference to the accompanying drawings.

Figure 1:
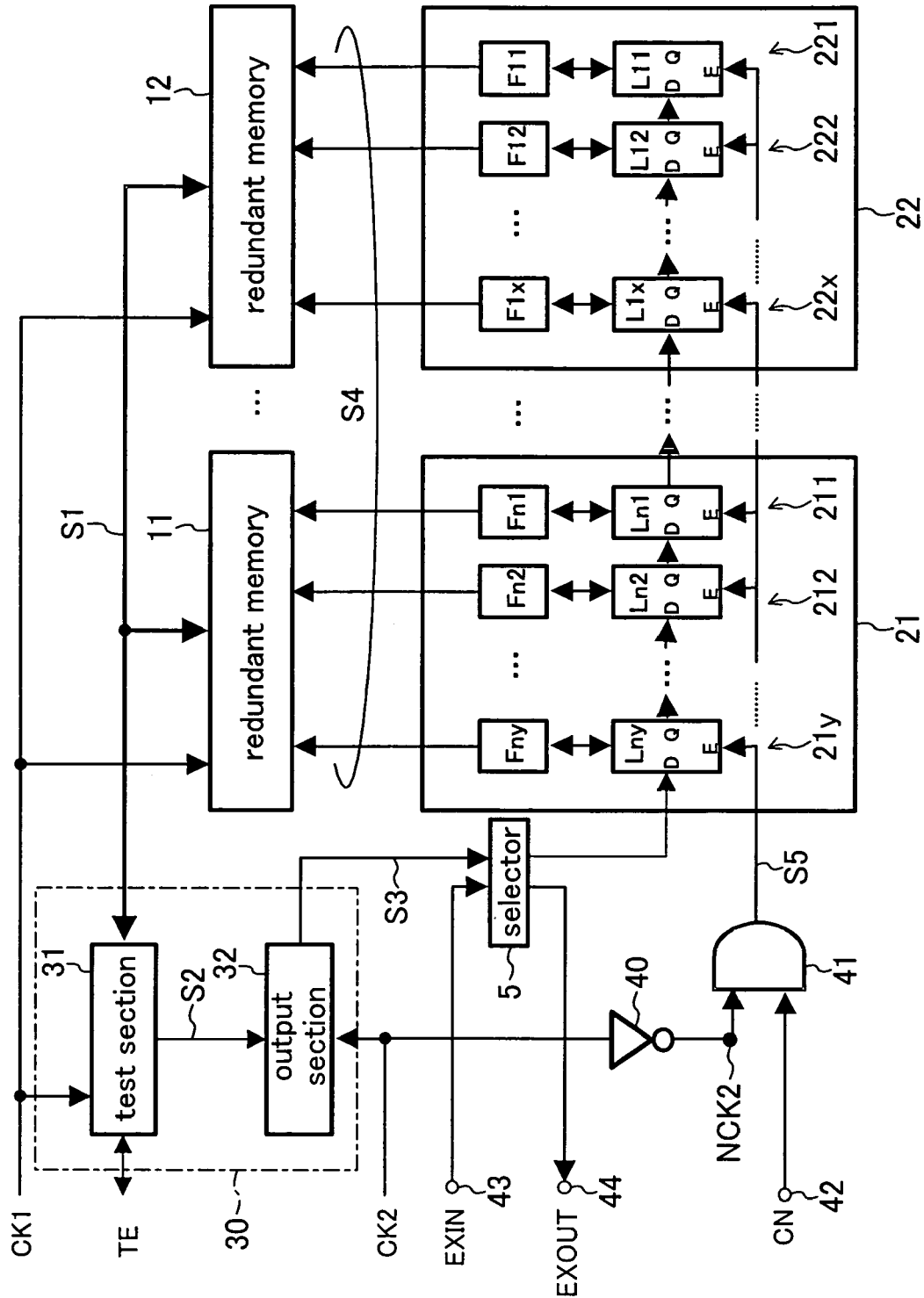
FIG. 1 is a block diagram illustrating a configuration of a semiconductor device according to an embodiment of the present invention.

FIG. 1 is a block diagram illustrating a configuration of a semiconductor device according to an embodiment of the present invention. In FIGS. 1, 11 and 12 indicate redundant memories each having a plurality of memory cells and a function of relieving a defective memory cell (defective cell), and 21 and 22 indicate relief processing sections for performing a relief process with respect to the redundant memories 11 and 12, respectively. The relief processing section 21 is paired with the redundant memory 11, and the relief processing section 22 is paired with the redundant memory 12. Note that there are other pairs of a redundant memory and a relief processing section and are not shown for the sake of simplicity.

The relief processing section 21 comprises a plurality of defect relief sections 211, 212, . . . , and 21y. The defect relief sections 211, 212, . . . , and 21y have shift register circuits Ln1, Ln2, . . . , and Lny (relief information storing sections) and electric fuse elements Fn1, Fn2, . . . , and Fny, respectively. Relief information stored in the shift register circuits Ln1, Ln2, . . . , and Lny are used as program information for the electric fuse elements Fn1, Fn2, . . . , and Fny, respectively. Similarly, the relief processing section 22 comprises a plurality of defect relief sections 221, 222, . . . , and 22x. The defect relief sections 221, 222, . . . , and 22x have shift register circuits L11, L12, . . . , and L1x (relief information storing sections) and electric fuse elements F11, F12, . . . , and F1x, respectively. Relief information stored in the shift register circuits L11, L12, . . . , and L1x are used as program information for the electric fuse elements F11, F12, . . . , and F1x, respectively.

In the relief processing section 21, the shift register circuits Ln1, Ln2, . . . , and Lny are connected in series so as to successively transfer data. Also, in the relief processing section 22, the shift register circuits L11, L12, . . . , and L1x are connected in series so as to successively transfer data. In addition, the serially-connected shift register circuits Ln1, Ln2, . . . , and Lny of the relief processing section 21 and the serially-connected shift register circuits L11, L12, . . . , and L1x of the relief processing section 22 are connected in series so as to successively transfer data.

The defect relief sections 211, 212, . . . , and 21y of the relief processing section 21 and the defect relief sections 221, 222, . . . , and 22x of the relief processing section 22 each comprise an electric fuse element so that relief information is held even when the semiconductor device is powered off. Note that, instead of the electric fuse element, a non-volatile memory element may be provided in which memory data is set based on relief information stored in a shift register circuit.

Also, in FIG. 1, the relief information storing sections in the defect relief sections are each composed of a shift register circuit, and may be each composed of any storage means which can be connected in series so as to successively transfer data.

A test circuit 30 comprises a test section 31 which tests the redundant memories 11 and 12 and an output section 32 which outputs relief information S3 for relieving a defective cell. The test section 31 receives external test signals TE, and performs a desired test with respect to the redundant memories 11 and 12 using internal test signals S1 including an address signal, a data input/output signal, a control signal and the like in accordance with a tester control. The test section 31 also detects whether the result of a test is passed or failed, and when the test is failed, determines whether or not redundancy relief is possible, and outputs test result information S2. The output section 32 receives the test result information S2 and serially outputs the relief information S3.

Note that the test section 31 does not need to output all the test result information S2 to the output section 32. Also, the output section 32 may output information which is not substantially used for relief when redundancy relief is not possible, for example. Information about the result of determining whether or not the test is passed or failed may be output.

42 indicates an external input terminal for inputting an intake control signal CN from the outside of the semiconductor device, 43 indicates a relief information external input terminal for inputting relief information EXIN from the outside of the semiconductor device, and 44 indicates a relief information externally output terminal for outputting the relief information S3 supplied to the relief processing sections 21 and 22 to the outside of the semiconductor device.

A selector 5 selects and outputs one of the relief information S3 output from the output section 32 and the relief information EXIN input through the relief information external input terminal 43. The relief information S3 or the relief information EXIN output from the selector 5 is supplied to an input D of the first-stage shift register circuit Lny of the serially-connected shift register circuits Ln1, Ln2, . . . , and Lny of the relief processing section 21.

A first clock CK1 is supplied to the test section 31 and the redundant memories 11 and 12. In other words, operations of the redundant memories 11 and 12 and a test of the redundant memories 11 and 12 by the test circuit 30 are performed in accordance with the first clock CK1.

A second clock CK2 is supplied to the output section 32, and is also supplied as a clock S5 via an inverter 40 and an AND gate 41 to the relief processing sections 21 and 22. The clock S5 is supplied to inputs E of the serially-connected shift register circuit Ln1, Ln2, . . . , and Lny of the relief processing section 21 and inputs E of the serially-connected shift register circuit L11, L12, . . . , and L1x of the relief processing section 22. In other words, an operation of storing the relief information S3 serially output from the output section 32 is performed in accordance with the second clock CK2.

Here, by providing the first clock CK1 and the second clock CK2 separately, different clocks can be supplied to different operations. For example, preferably, the first clock CK1 is a high-speed clock and the second clock CK2 is a low-speed clock. Thereby, a test for a redundant memory can be performed with high speed. On the other hand, the relief information transfer operation, which does not contribute to the system performance, is performed with low speed, thereby making it possible to suppress an increase in waste circuit area. Note that the first clock CK1 and the second clock CK2 may be the same clock.

The AND gate 41 (clock controller) receives a clock NCK2 which is output from the inverter 40 and has an inverted phase of the second clock CK2, and the intake control signal CN supplied through the external terminal 42, and outputs the clock S5. The clock S5 is the same as the inverted-phase clock NCK2 when the intake control signal CN is at "H", and is fixed to an "L" level when the intake control signal CN is at "L". In other words, whether the clock input to the relief processing sections 21 and 22 is valid or invalid is controlled in accordance with the intake control signal CN.

Figure 2:
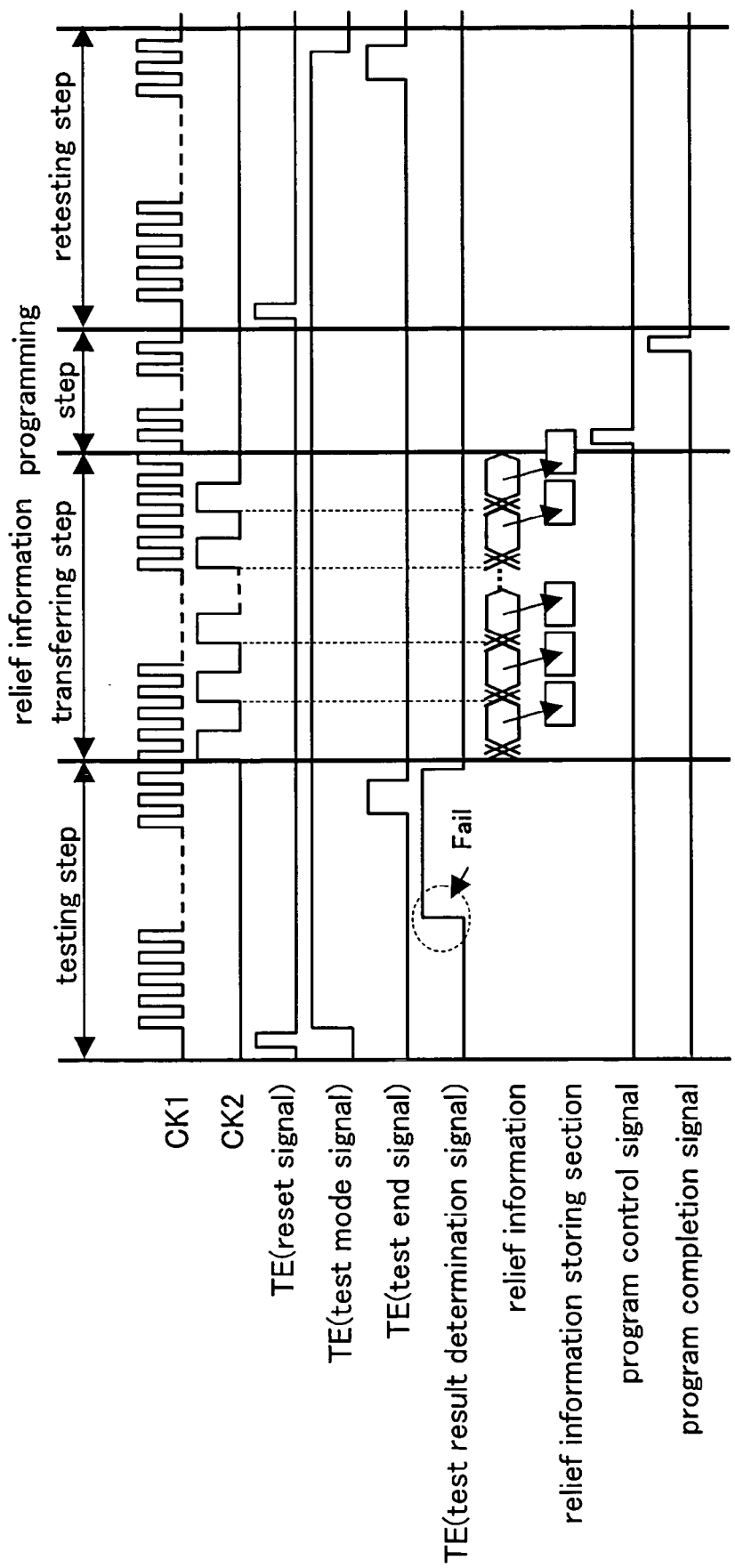
FIG. 2 is a timing chart illustrating a flow of a test using the semiconductor device of FIG. 1.

Hereinafter, an operation of the semiconductor device of FIG. 1 during a test will be described, illustrating each step of the test. FIG. 2 is a timing chart illustrating a flow of the test using the semiconductor device of FIG. 1.

<1. Testing Step>

In FIG. 2, the external test signals TE are assumed to include a reset signal, a test mode signal, a test end signal and a detect result determination signal. Initially, the test section 31 and the redundant memories 11 and 12 are initialized using the reset signal. Thereafter, a test mode is set (the test mode signal is at "H"), and thereafter, a test for the redundant memories 11 and 12 is started in synchronized with the first clock CK1. When a defective cell is detected during the test, the detect result determination signal goes from "L" to "H" (Fail). Thereafter, when the desired test is ended, the test end signal goes to "H" for a predetermined period of time.

<2. Relief Information Transferring Step>

Figure 3:
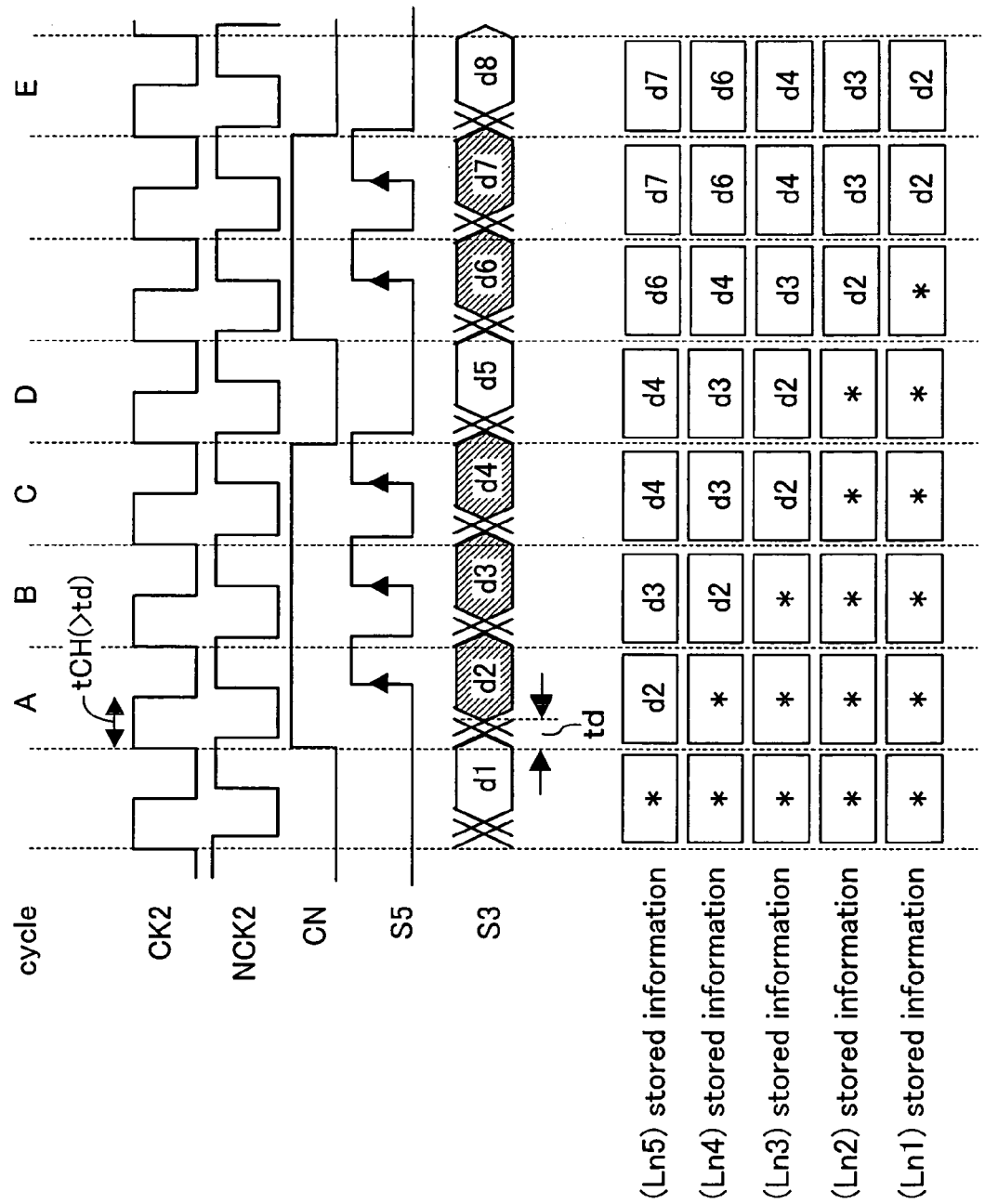
FIG. 3 is a timing chart illustrating a relief information storing operation.

FIG. 3 is a timing chart illustrating a relief information storing operation. Here, the output section 32 is assumed to serially output the relief information S3 in synchronization with the second clock CK2, and the selector 5 is assumed to select the relief information S3 output from the output section 32 and supply the selected relief information S3 to the relief processing section 21. In the relief processing section 21, y is assumed to be five, i.e., the number of serially-connected shift register circuits is assumed to be five. Specifically, the relief information S3 output from the selector 5 is supplied to the input D of the shift register circuit Ln5, and thereafter, is transferred to the shift register circuits Ln4, Ln3, Ln2, and Ln1 in this order in accordance with the clock S5.

The relief information S3 is output from the output section 32 in synchronization with the rise of the second clock CK2. When the relief information S3 is truly required data, the intake control signal CN goes to "H" so as to take in the relief information S3. In other words, even when the relief information S3 contains data which is not required for redundancy relief, the control employing the intake control signal CN allows only truly required relief information to be selectively stored into the relief processing sections 21 and 22.

The relief information S3 reaches the terminal D of the shift register circuit Ln5 after a predetermined signal propagation delay time td elapses. Here, the second clock CK2 has a period of time tCH during which it is at "H" is guaranteed by the circuit as follow.

tCH>td

Therefore, the clock S5 obtained based on the inverted-phase clock NCK2 of the second clock CK2 has a waveform which rises after the relief information S3 certainly reaches the terminal D of the shift register circuit Lny. Specifically, by generating the clock S5 to be supplied to the relief processing sections 21 and 22 using the inverted-phase clock NCK2 of the second clock CK2, it is caused to be easy to design timing of certainly taking the relief information S3 into the shift register circuit.

Note that test pattern information is preferably used as the intake control signal CN. The relief information S3 may include other information as well as that which is required for redundancy relief, and it is necessary to perform a control so that such unnecessary information is not taken in. Typically, in a logical verification step, the certainty of a waveform for performing a relief information intake control can be confirmed with a simulation result waveform. Specifically, a logically guaranteed test pattern after the simulation result waveform is converted into a format which can be used on a predetermined tester, is input as the intake control signal CN to the external input terminal 42, thereby making it possible to perform a safe control which is logically guaranteed.

Now, the output section 32 serially outputs data "d1" to "d8" as the relief information S3. Thereafter, among the output data, the data "d2", "d3", "d4", "d6" and "d7" (hatched) are stored as truly required relief information into the shift register circuits Ln1 to Ln5. The intake control signal CN goes to "H" only for a period of time during which the data "d2", "d3", "d4", "d6" and "d7" are output.

In a cycle (cycle A) during which the data "d2" is output as the relief information S3, the data "d2" is stored into the shift register circuit Ln5 at timing of the rise of the clock S5 controlled using the intake control signal CN. Next, in a cycle (cycle B) during which the data "d3" is output as the relief information S3, the data "d3" is stored into the shift register circuit Ln5 at timing of the rise of the clock S5, and the data "d2" stored in the shift register circuit Ln5 is transferred to the next-stage shift register circuit Ln4.

In a cycle (cycle C) during which the data "d4" is output as the relief information S3, the data "d4" is stored into the shift register circuit Ln5 at timing of the rise of the clock S5, the data "d3" stored in the shift register circuit Ln5 is transferred to the next-stage shift register circuit Ln4, and the data "d2" stored in the shift register circuit Ln4 is transferred to the next-stage shift register circuit Ln3.

In a cycle (cycle D) during which the next data "d5" is output, the intake control signal CN goes to "L", so that the clock S5 remains at "L". Therefore, the data "d5" is not stored into the shift register circuit Ln5 and no data is transferred to the following shift register circuits, so that the stored data is held as they are.

Thereafter, similarly, the relief information S3 is taken in in accordance with the intake control signal CN, and a data transfer operation between each shift register circuit is controlled. Subsequently, after the end of a cycle (cycle E) during which the data "d8" is output, the data "d2", "d3", "d4", "d6" and "d7" are stored in the shift register circuits Ln1 to Ln5, respectively.

<3. Programming Step>

Regarding a programming step, only general things required to understand a test flow will be described and details thereof will not be described. Note that the technical idea of the present invention is not limited by the programming method.

In FIG. 1, predetermined relief information is assumed to be stored in the shift register circuits Ln1 to Lny and L11 to L1x of the relief processing sections 21 and 22. The relief processing sections 21 and 22 are provided with a program control circuit (not shown) for programming the relief information stored in the shift register circuits Ln1 to Lny and L11 to L1x into the electric fuse elements Fn1 to Fny and F11 to F1x.

The program control circuit receives a program control signal (FIG. 2), and executes programming, i.e., programs the relief information stored in the shift register circuits Ln1 to Lny and L11 to L1x into the electric fuse elements Fn1 to Fny and F11 to F1x, respectively. Thereafter, when the desired programming operation is completed, the program control circuit outputs a program completion signal.

<4. Retesting Step>

Regarding a retesting step, only general things required to understand a test flow will be described and details thereof will not be described. Note that the technical idea of the present invention is not limited by the retesting method.

In FIG. 1, even when the redundant memories 11 and 12 have a defective cell, the above-described programming operation (fuse cutting act) avoids access to the defective cell, and allows access to a spare memory cell. Thereby, the redundant memories 11 and 12 can be normally operated.

In FIG. 2, relief process information S4 programmed in the electric fuse elements Fn1 to Fny and F11 to F1x is validated by setting of the reset signal. Thereafter, a test similar to that which has been described in <1. Testing step> is performed. In this case, since redundancy relief has been performed, the detect result determination signal remains at "L". Thereafter, when the retest is ended, the test end signal goes to "H" only for a predetermined period of time.

<5. Analysis>

As described above, the relief information EXIN externally input through the relief information external input terminal 43 can be input via the selector 5 to the relief processing sections 21 and 22. Also, the relief information S3 output from the output section 32 can be output as data EXOUT via the relief information externally output terminal 44 to the outside. By using such external input/output, when, for example, redundancy relief is not normally performed in the semiconductor device, it is possible to analyze whether or not relief can be performed using additional relief information externally supplied, or output relief information generated in the semiconductor device and analyze the contents thereof.

According to the above-described embodiment, the shift register circuits Ln1 to Lny and L11 to L1x (relief information storing sections) are connected in series so as to successively transfer data. In the relief information storing operation, the relief information S3 serially output from the test circuit 30 is stored into the shift register circuits Ln1 to Lny and L11 to L1x of the relief processing sections 21 and 22 using the data transfer operation. Therefore, relief information can be efficiently transferred to the relief processing sections, and it is not necessary to provide a large number of conductors (relief information transfer channels), thereby making it possible to suppress an increase in circuit area.

Also in the embodiment, whether the clock S5 is valid or invalid is controlled by the AND gate 41 in accordance with the intake control signal CN, thereby achieving a control of whether or not to store the relief information S3. With such a technique, it is possible to certainly control whether or not to store relief information. Note that whether the clock S5 is valid or invalid can be controlled by other configurations as well as an AND gate.

To control whether or not to store relief information, other method are considered as well as the method of controlling whether a clock input to the relief processing section is valid or invalid. For example, in the configuration of FIG. 1, each relief information storing section is composed of a register circuit having a clock input and an enable input. In addition, the second clock CK2 (or the inverted-phase clock NCK2) is supplied to the clock input and the intake control signal CN is supplied to the enable input. With such a configuration, it is possible to control whether or not to store relief information.

Also in the embodiment, a plurality of pairs of a redundant memory and a relief processing section are assumed to be provided. Alternatively, the present invention is valid even when only one pair of a redundant memory and a relief processing section is provided. Also, when there are a plurality of pairs of a redundant memory and a relief processing section, a test circuit may be provided for each pair.

According to the present invention, in a semiconductor device comprising a test circuit for generating relief information for relieving a defective cell, the relief information can be efficiently transfer without leading to an increase in circuit area. Therefore, the present invention is useful to reduce the circuit area of a semiconductor device having a number of memories, for example.

What is claimed is:

1. A semiconductor device comprising:
   a redundant memory having a plurality of memory cells and a function of relieving a defective cell which is one of the memory cells which is defective;
   a test circuit for performing a test on the redundant memory, and when determining that there is a defective cell, outputting a relief information for relieving the defective cell; and
   a relief processing section having a plurality of defect relief sections each having a relief information storing section capable of storing the relief information, for performing a relieve process with respect to the redundant memory,
   wherein the relief information storing sections are connected in series so as to successively transfer data, and
   in an operation of storing the relief information, the test circuit outputs the relief information serially, and the relief processing section stores the relief information serially output from the test circuit into the relief information storing sections using a data transfer operation thereof.

2. The semiconductor device of claim 1, wherein the device is capable of controlling whether or not to store the relief information output from the test circuit into the relief processing section, in accordance with an intake control signal supplied thereto.

3. The semiconductor device of claim 2, further comprising an external input terminal for inputting the intake control signal from the outside of the semiconductor device.

4. The semiconductor device of claim 2, wherein the data transfer operation of the relief information storing section is performed in accordance with a clock signal supplied thereto, and
   the device further comprises:
      a clock controller for controlling whether or not the clock signal is valid or invalid, in accordance with the intake control signal.

5. The semiconductor device of claim 1, wherein each of the plurality of defect relief sections is configured to hold the relief information when the semiconductor device is powered off.

6. The semiconductor device of claim 5, wherein each of the plurality of defect relief sections has an electric fuse element which is programmed based on the relief information stored in the relief information storing section.

7. The semiconductor device of claim 5, wherein each of the plurality of defect relief sections has a non-volatile memory element in which memory data is set based on the relief information stored in the relief information storing section.

8. The semiconductor device of claim 1, wherein:
the operation of the redundant memory and the test for the redundant memory by the test circuit are performed in accordance with a first clock; and
the relief information storing operation is performed in accordance with a second clock different from the first clock.

9. The semiconductor device of claim 8, wherein:
in the relief information storing operation, the second clock is supplied to the test circuit, while an inverted-phase clock of the second clock is supplied to the relief processing section.

10. The semiconductor device of claim 1, wherein:
the device comprises a plurality of pairs of the redundant memory and the relief processing section; and
the plurality of relief information storing sections serially connected of the respective plurality of relief processing sections are connected in series so as to successively transfer data.

11. The semiconductor device of claim 1, further comprising:
a relief information external input terminal for inputting relief information from the outside of the semiconductor device; and
a selector for selecting and supplying one of the relief information output from the test circuit and the relief information input through the relief information external input terminal, to the relief processing section.

12. The semiconductor device of claim 1, further comprising:
a relief information externally output terminal for outputting the relief information supplied to the relief processing section, to the outside of the semiconductor device.

* * * * *